US012795971B2

(12) United States Patent
Wu et al.

(10) Patent No.: US 12,795,971 B2
(45) Date of Patent: Nov. 10, 2026

(54) METHOD OF OPTIMIZING FIN HEIGHTS FOR FINFETS BY RECESSING ISOLATION STRUCTURES EXPOSED IN GATE TRENCHES

(71) Applicant: Taiwan Semiconductor Manufacturing Company, Ltd., Hsinchu (TW)

(72) Inventors: Wei-Hao Wu, Hsinchu City (TW); Sheng-Fu Yu, Chiayi City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 589 days.

(21) Appl. No.: 18/327,628

(22) Filed: Jun. 1, 2023

(65) Prior Publication Data

US 2024/0405099 A1 Dec. 5, 2024

(51) Int. Cl.

| | |
|---|---|
| ***H10D 30/01*** | (2025.01) |
| ***H10D 30/62*** | (2025.01) |
| ***H10D 64/01*** | (2025.01) |
| ***H10P 50/28*** | (2026.01) |
| ***H10W 10/00*** | (2026.01) |
| ***H10W 10/17*** | (2026.01) |

(52) U.S. Cl.

CPC ....... *H10D 30/024* (2025.01); *H10D 30/0245* (2025.01); *H10D 30/62* (2025.01); *H10D 64/017* (2025.01); *H10P 50/283* (2026.01); *H10W 10/014* (2026.01); *H10W 10/17* (2026.01)

(58) Field of Classification Search

CPC ........... H10D 84/0158; H10D 84/0193; H10D 84/834; H10D 84/853; H10D 86/011; H10D 86/215; H10D 30/024–0245; H10D 30/62–6219; H10D 84/0135; H10D 84/014; H10D 84/0142; H10D 84/0172; H10D 84/0177; H10D 84/0179; H10D 64/017; H10D 64/517; H10D 64/518; H10D 30/673; H10D 62/115; H10D 62/116; H10D 84/0151; H10D 84/0153; H10D 84/0188; H10D 30/0243; H10B 12/36; H10B 12/056; H01L 21/28114; H01L 21/28088; H01L 21/76224; H01L 21/76229; H01L 21/76232; H10W 10/014; H10W 10/0143; H10W 10/0145; H10W 10/17

See application file for complete search history.

(56) References Cited

U.S. PATENT DOCUMENTS

| | | | |
|---|---|---|---|
| 8,946,829 | B2 | 2/2015 | Wann et al. |
| 10,164,062 | B2 | 12/2018 | Lin et al. |
| 10,170,375 | B2 | 1/2019 | Lee et al. |

(Continued)

FOREIGN PATENT DOCUMENTS

| | | | |
|---|---|---|---|
| TW | I617034 | B | 3/2018 |
| TW | 202143444 | A | 11/2021 |
| TW | 202320143 | A | 5/2023 |

*Primary Examiner* — Younes Boulghassoul

(74) *Attorney, Agent, or Firm* — HAYNES AND BOONE, LLP

(57) ABSTRACT

Method and devices that include a recessed isolation region in a trench region formed by the removal of a dummy gate structure. The recessed isolation region can allow a greater fin height in the channel region. A metal gate structure may be formed on the recessed isolation region and fin.

20 Claims, 18 Drawing Sheets

(56) References Cited

U.S. PATENT DOCUMENTS

| | | | | |
|---|---|---|---|---|
| 2013/0334595 | A1* | 12/2013 | Liaw | H10D 64/017 438/270 |
| 2014/0061792 | A1* | 3/2014 | Bu | H10D 30/62 257/E29.273 |
| 2014/0312398 | A1* | 10/2014 | Ching | H10D 30/024 257/288 |
| 2015/0270401 | A1* | 9/2015 | Huang | H10D 30/024 257/192 |
| 2016/0218180 | A1* | 7/2016 | You | H10D 64/017 |
| 2016/0240650 | A1* | 8/2016 | Chang | H10D 30/024 |
| 2017/0141106 | A1* | 5/2017 | Chang | H10D 84/834 |
| 2017/0256540 | A1* | 9/2017 | Duriez | H10D 30/024 |
| 2018/0301558 | A1* | 10/2018 | Chiang | H10D 30/6211 |
| 2019/0355811 | A1 | 11/2019 | Mehandru | |
| 2020/0127124 | A1* | 4/2020 | Ching | H10D 30/0245 |
| 2020/0135725 | A1 | 4/2020 | Wu | |
| 2021/0036130 | A1* | 2/2021 | Su | H10D 30/024 |
| 2021/0125833 | A1* | 4/2021 | Lin | H10D 64/01334 |

* cited by examiner

METHOD OF OPTIMIZING FIN HEIGHTS FOR FINFETS BY RECESSING ISOLATION STRUCTURES EXPOSED IN GATE TRENCHES

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes (such as 32 nanometers, 28 nanometers, 20 nanometers, and below), advanced techniques are needed for precisely controlling fin profiles and/or dimensions to ensure and optimize FinFET performance, reliability and/or manufacturability. Although existing device formation techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
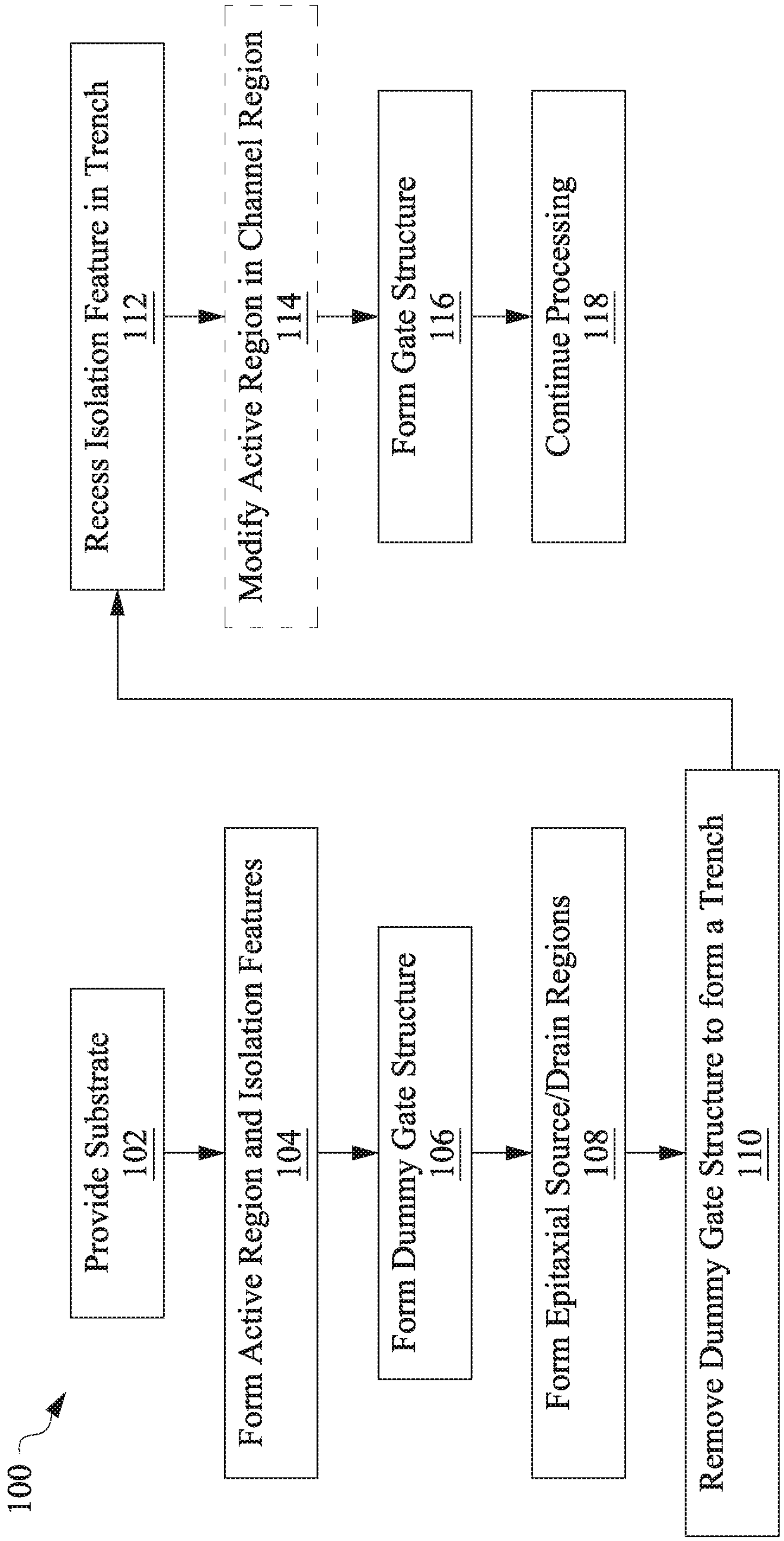
FIG. 1 is a flow chart of a method for fabricating a fin-like field effect transistor (FinFET) device according to various aspects of the present disclosure.

The present disclosure relates generally to integrated circuit devices, and more particularly, to fin-like field effect transistors (FinFETs). However, the present disclosure may also apply to other types of transistors including other multi-gate transistors such as gate-all-around (GAA) devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for case of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing. For example, the number or range of numbers encompasses numbers within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

Fin-type field effect transistors or FinFETs have become a popular and promising candidate for high performance and low leakage applications. As FinFETs are scaled down through various technology nodes, it may be desirable to change its geometry, for example, decrease a width of the fin or increase its height for improved transistor performance considerations. However, fabrication of such a tall structure raises issues during processing such as a fin collapsing during fabrication. Thus, the present disclosure provides, in some embodiments, methods and devices that allow for improved drive current, better short channel control, less source/drain leakage, and/or other performance improvements in transistor performance including those achieved by geometric modification of the fin. The methods and devices provided may provide any one of these performance benefits while also improving fin structural support by maintaining a wider and/or shorter fin for an initial processing, and modifying the aspect ratio, width, or height of the fin during subsequent processing (e.g., replacement gate process). As discussed above, while described with respect to a fin-type active region, similar performance enhancements and processing benefits may be achieved applying aspects to other configurations of active regions.

According to one example of principles described herein, a FinFET device has an increased height in the portion that is covered by the gate structure (e.g., channel in z-direction). This increased height can improve the performance of the FinFET. Additionally, the portions of the fin not covered by the gate structure may have a larger width, thus providing the desired structural support. In some examples, fabricating such a device includes forming a dummy gate structure around the fin structure, depositing an interlayer dielectric (ILD), and removing the dummy gate structure to form a trench. After removing the dummy gate structure, the portion of the fin over which the replacement metal gate structure will be placed is exposed as is the adjacent dielectric (e.g., shallow trench isolation (STI)) between fins. Thus, an etching process may be applied to recess the adjacent dielectric increasing the height of the fin. In some implementations, an etching process may also be applied to reduce the width of the fin structure at the exposed portion. The other portions of the fin structure are covered by the ILD and are thus not affected by the etching process. After the etching process(es) modifying the fin shape, a replacement gate can be formed. Using this technique, a fin structure may be short/wide enough to provide the desired structural strength during processing, while being tall/narrow enough in the channel regions so as to provide improved performance of transistor devices.

FIG. 1 is a flow chart of a method 100 for fabricating an integrated circuit device according to various aspects of the present disclosure. In the present embodiment, method 100 fabricates an integrated circuit device that includes a FinFET device. However, in other implementations, the method 100 may also apply to other device types such as gate-all-around devices.

Exemplary embodiments of the method are provided with reference to FIGS. 2A-9E, which illustrate a FinFET device 200, in portion, according to various aspects of the present disclosure. FIGS. 2A, 3A, 4A, 5A, 6A, 7A, 8A, and 9A are fragmentary top view of the FinFET device 200. The top views typically omit one or more layers or features for case of illustration. FIGS. 2B, 3B, 4B, 5B, 6B, 7B, 8B, and 9B are fragmentary cross-sectional views of the FinFET device 200 in an X-X' plane cut of the respective top view figure; FIGS. 2C, 3C, 4C, 5C, 6C, 7C, 8C, and 9C are fragmentary cross-sectional views of the FinFET device 200 in an Y1-Y1' plane (e.g., isolation region) cut of the respective top view figure at various fabrication stages, such as those associated with the method of FIG. 1, according to various aspects of the present disclosure. FIGS. 2D, 3D, 4D, 5D, 6D, 7D, 8D, and 9D are fragmentary cross-sectional views of a FinFET device in an Y2-Y2' plane (e.g., along fin active region) cut of the respective top view figure at various fabrication stages, such as those associated with the method of FIG. 1, according to various aspects of the present disclosure. FIGS. 6E, 7E 8E, and 9E are fragmentary cross-sectional views of the FinFET device in an X2-X2' plane cut of the respective top view figure at various fabrication stages, such as those associated with the method of FIG. 1, according to various aspects of the present disclosure.

In some embodiments, FinFET device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. FIGS. 2A-9E have been simplified for the sake of clarity to better understand the inventive concepts of the present disclosure. Additional features can be added in FinFET device 200, and some of the features described below can be replaced, modified, or eliminated in other embodiments of FinFET device 200. FIGS. 7A, 7B, 7C, 7D, and 7E illustrate an embodiment of the FinFET device 200'; FIGS. 8A, 8B, 8C, 8D, and 8E illustrate a modification of the FinFET device 200", which are each substantially similar to the FinFET device 200 with differences noted.

At block 102 of the method 100 of FIG. 1, a substrate is provided. Referring to the example of FIGS. 2A, 2B, 2C, and 2D, a substrate (e.g., wafer) 202 is provided for a FinFET device 200. In an embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of FinFET device 200.

Figure 2A:
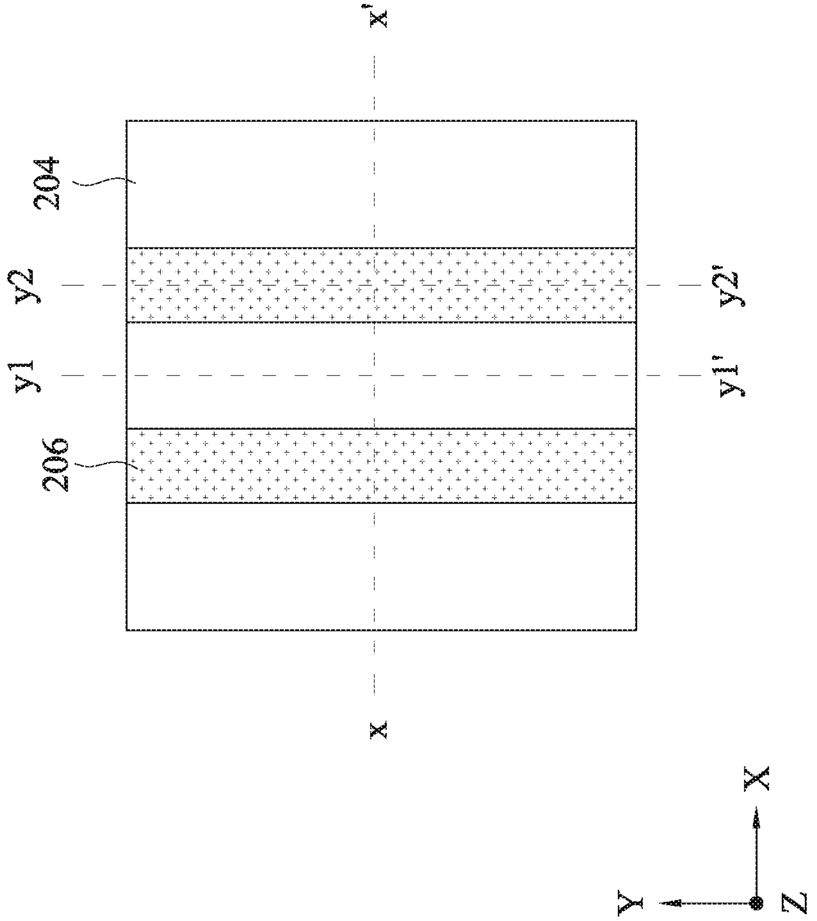
FIGS. 2A, 3A, 4A, 5A, 6A, 7A, 8A, and 9A are fragmentary top view of a FinFET device according to an embodiment of various fabrication stages, such as those associated with the method of FIG. 1, according to various aspects of the present disclosure.
Figure 2B:
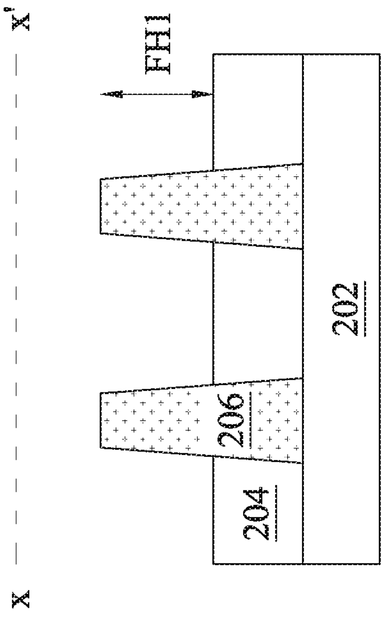
FIGS. 2B, 3B, 4B, 5B, 6B, 7B, 8B, and 9B are fragmentary cross-sectional views of a FinFET device in an X-X' plane cut of the respective top view figure at various fabrication stages, such as those associated with the method of FIG. 1, according to various aspects of the present disclosure.
Figure 2C:
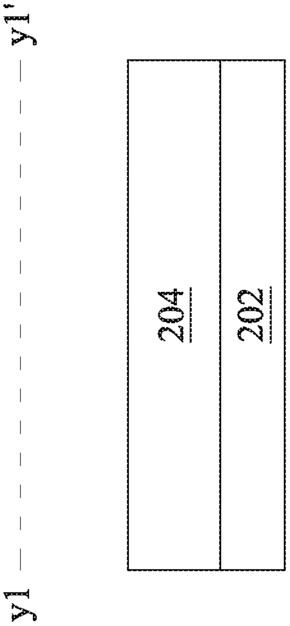
FIGS. 2C, 3C, 4C, 5C, 6C, 7C, 8C, and 9C are fragmentary cross-sectional views of a FinFET device in an Y1-Y1' plane (e.g., isolation region) cut of the respective top view figure at various fabrication stages, such as those associated with the method of FIG. 1, according to various aspects of the present disclosure.
Figure 2D:
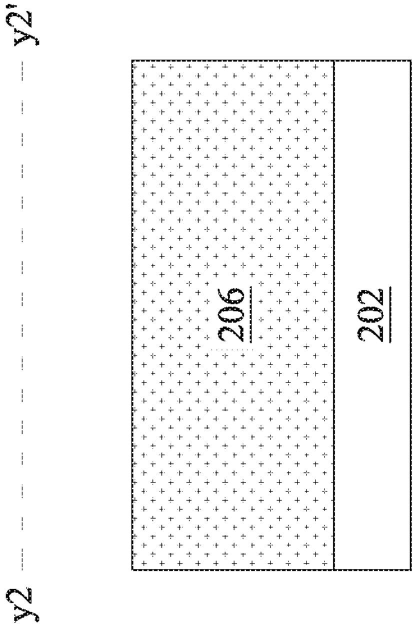
FIGS. 2D, 3D, 4D, 5D, 6D, 7D, 8D, and 9D are fragmentary cross-sectional views of a FinFET device in an Y2-Y2' plane (e.g., along active region) cut of the respective top view figure at various fabrication stages, such as those associated with the method of FIG. 1, according to various aspects of the present disclosure.

At block 104 of the method 100, active regions and isolation regions are defined on the substrate. In an embodiment, the active regions may be formed in semiconductor structures extending from the substrate, also referred to as fin-type active regions in the illustrative and exemplary FinFET device. However, in forming other devices, other configurations of active regions may be formed. Referring to the example of FIGS. 2A, 2B, 2C, and 2D, a fin structure 206 is formed over substrate 202. In FIGS. 2A and 2B, two fins 206 are illustrated. The present disclosure contemplates embodiments where fin 206 includes more fins or a single fin extending from substrate 202. Fins 206 extend substantially parallel to one another along a y-direction and having a length defined in the y-direction, a width defined in an x-direction, and a height defined in the z-direction. For example, a fin height FH1 of fins 206 is defined between a top surface of an isolation feature 204, discussed below, and respective top surfaces of fins 206 along the z-direction. In some embodiments, fin height FH1 is about 40 nm to about 70 nm. Fins 206 each have a channel region (C), a source region (S/D), and a drain region (S/D) defined along their length (here, along the y-direction), where the channel region is disposed between the source region and the drain region, both of which are collectively referred to as source/drain (S/D) regions. A gate structure, described below, is formed over the channel region (C) of the fin 206.

In some embodiments, fins 206 are a portion of substrate 202. For example, in an embodiment, where substrate 202 includes silicon, fins 206 may include silicon. Alternatively, fins 206 are defined in a material layer or layers, such as a semiconductor material layer(s), disposed on substrate 202. The semiconductor material may be silicon, germanium, silicon germanium, III-V semiconductor material, other suitable semiconductor material, or combinations thereof. In some embodiments, fins 206 include a stack of semiconductor layers disposed over substrate 202. The semiconductor layers can include same or different materials, dopants, etching rates, constituent atomic percentages, constituent weight percentages, thicknesses, and/or configurations depending on design requirements of FinFET device 200. In an embodiment, the stack of semiconductor layers forming the fins 206 include alternating channel layers and sacrificial layers.

A combination of deposition, lithography, and/or etching processes may be performed to define fins 206 extending from substrate 202. For example, forming fins 206 includes performing a lithography process to form a patterned mask layer over substrate 202 (or a material layer (e.g., epitaxial layer or layers) disposed over substrate 202) and performing an etching process to transfer a pattern defined in the patterned mask layer to substrate 202 (or the material layer). The lithography process can include forming a resist layer over substrate 202 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. In some embodiments, the patterned resist layer is the patterned mask layer. In such embodiments, the patterned resist layer is used as an etch mask to remove portions of substrate 202 (or the material layer). In some embodiments, the patterned resist layer is formed over a mask layer formed over substrate 202 before forming the resist layer, and the patterned resist layer is used as an etch mask to remove portions of the mask layer formed over substrate 202. In such embodiments, the patterned mask layer is used as an etch mask to remove portions of substrate 202 (or the material layer). The etching process can include a dry etching process, a wet etching process, other suitable etching process, or combinations thereof. In some embodiments, a reactive ion etching (RIE) process is used to form fins 206. After the etching process, the patterned resist layer is removed from substrate 202, for example, by a resist stripping process. In some embodiments, after the etching process, patterned mask layer is removed from substrate 202 (in some embodiments, by a resist stripping process). In some embodiments, the patterned mask layer is removed during etching of substrate 202 (or the material layer). Alternatively, fins 206 are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented for forming fins 206. Further, in some alternate embodiments, the exposure process can implement maskless lithography, e-beam writing, and/or ion-beam writing for patterning.

An isolation feature(s) 204 is formed over and/or in substrate 202 to separate and isolate various regions of FinFET device 200, such as one fin 206 from an adjacent fin 206. In the depicted embodiment, isolation feature 204 surrounds a lower portion of fins 206. Upper portions of fins 206 extend above isolation feature 204 along the z-direction, such that top surfaces of fins 206 are disposed above a top surface of isolation feature 204 along the z-direction. The upper portion of the fins 206 may form the channel region of the device 200. Isolation feature 204 includes silicon oxide, silicon nitride, silicon oxynitride, other suitable isolation material (for example, including silicon, oxygen, nitrogen, carbon, or other suitable isolation constituent), or combinations thereof. Isolation feature 204 can be configured as a shallow trench isolation (STI) structure, a deep trench isolation (DTI) structure, and/or local oxidation of silicon (LOCOS) structure. For example, isolation feature 204 may be an STI feature that defines and electrically isolates fins 206 from each other. The STI feature can be formed by etching a trench in substrate 202 (for example, by using a dry etching process and/or a wet etching process) and filling the trench with insulator material (for example, using a chemical vapor deposition (CVD) process or a spin-on glass process). A chemical mechanical polishing (CMP) process may be performed to remove excess insulator material and/or planarize the top surface of isolation feature 204. The insulator material may then be etched back to form the fin 206 raising the fin height FH1 above the isolation feature 204. In another example, the isolation feature can be formed by depositing an insulator material over substrate 202 after forming fins 206 (in some embodiments, such that the insulator material layer fills gaps (trenches) between fins 206) and etching back the insulator material layer to form isolation feature 204 with fin 206 extending a fin height FH1 above the etched back isolation feature 204. In some embodiments, the isolation feature includes a multi-layer structure that fills the trenches, such as a silicon nitride layer disposed over a thermal oxide liner layer. In another example, the isolation feature 204 includes a dielectric layer disposed over a doped liner layer (including, for example, boron silicate glass (BSG) or phosphosilicate glass (PSG)). In yet another example, the isolation feature includes a bulk dielectric layer disposed over a liner dielectric layer, where the bulk dielectric layer and the liner dielectric layer include materials depending on design requirements of FinFET device 200. While illustrated as having a planar surface, the isolation features 204 may include a curvilinear or bowed surface between fins 206. A fin height FH1 may be measured in the z-direction from an interface of the isolation feature 204 and the fin 206.

Figure 3A:
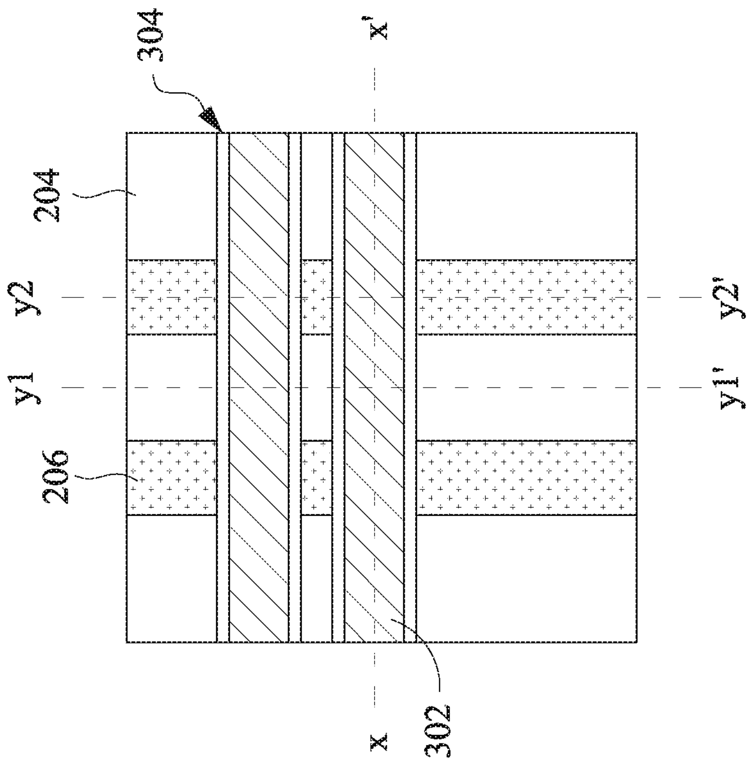
Figure 3B:
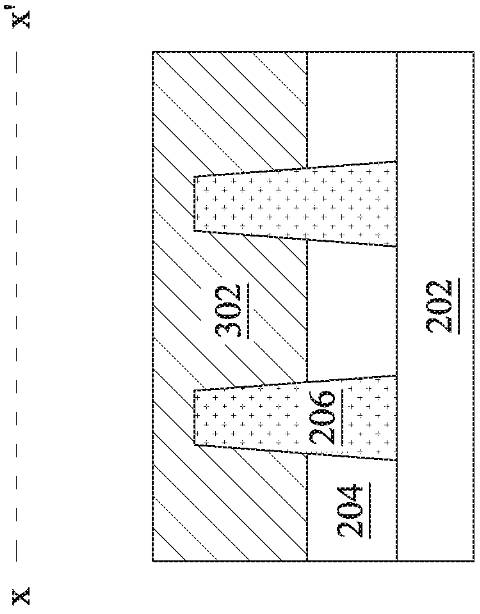
Figure 3C:
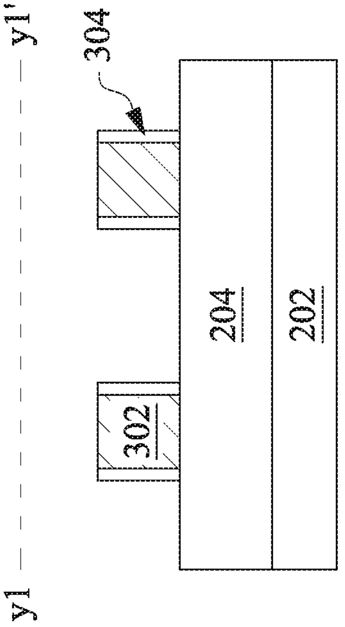
Figure 3D:
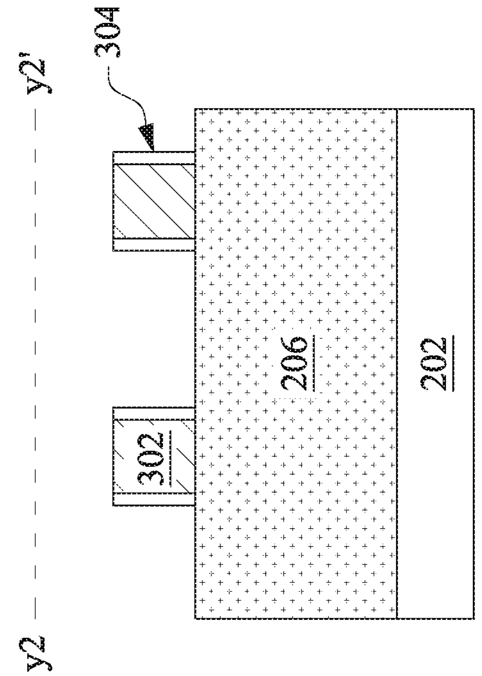
Figure 4A:
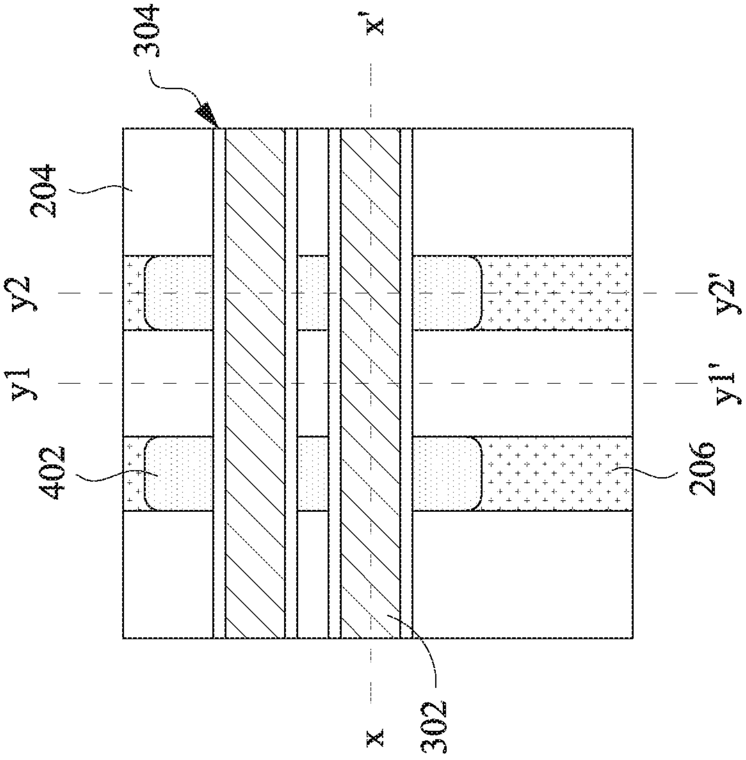
Figure 4B:
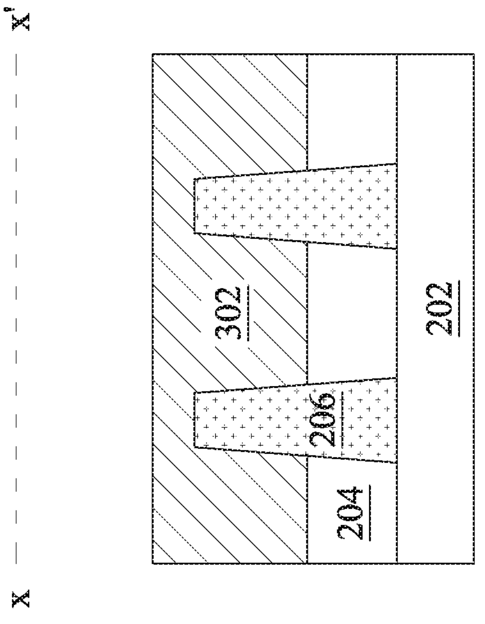
Figure 4C:
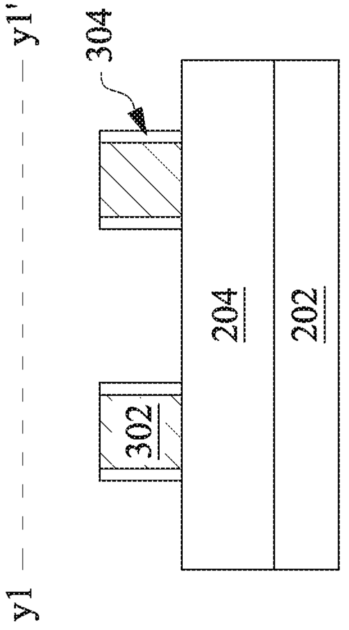
Figure 4D:
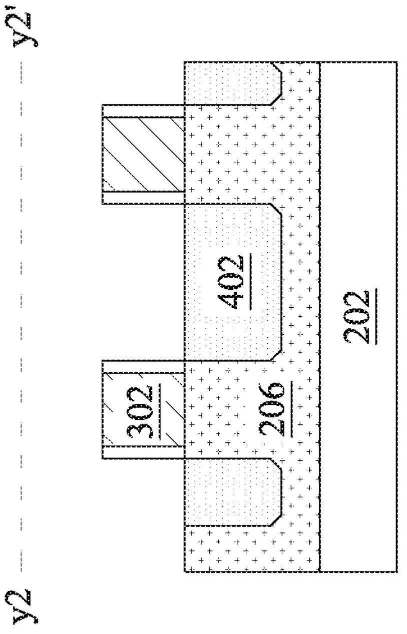
Figure 5A:
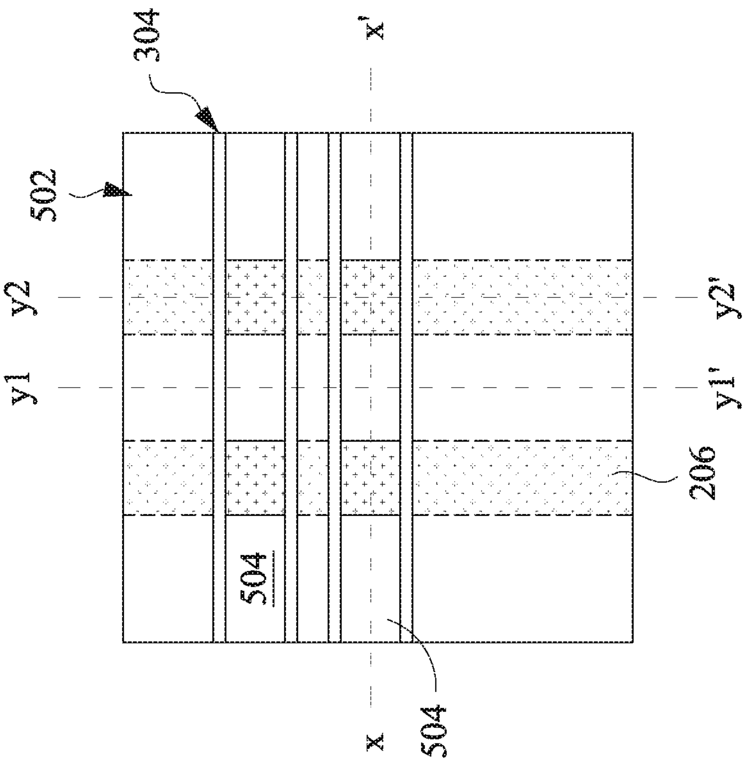
Figure 5B:
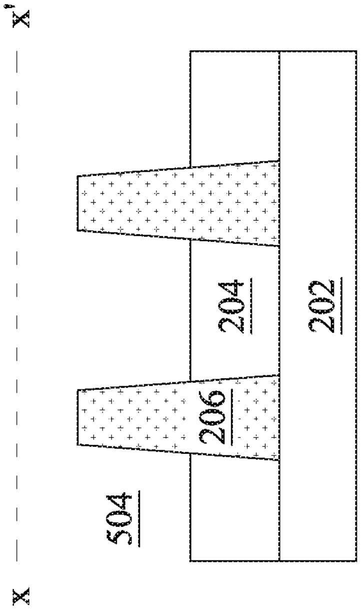
Figure 5C:
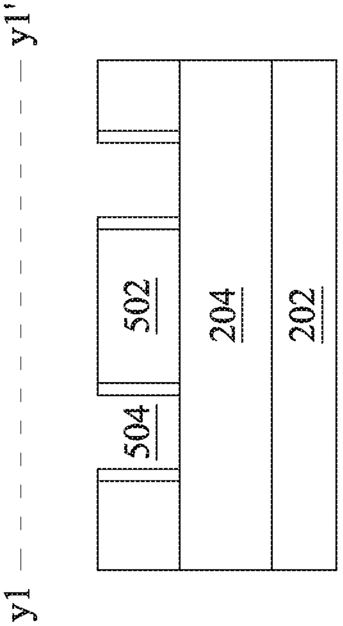
Figure 5D:
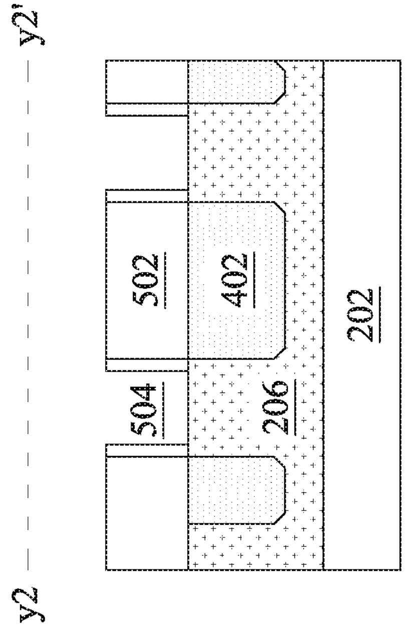
Figure 6A:
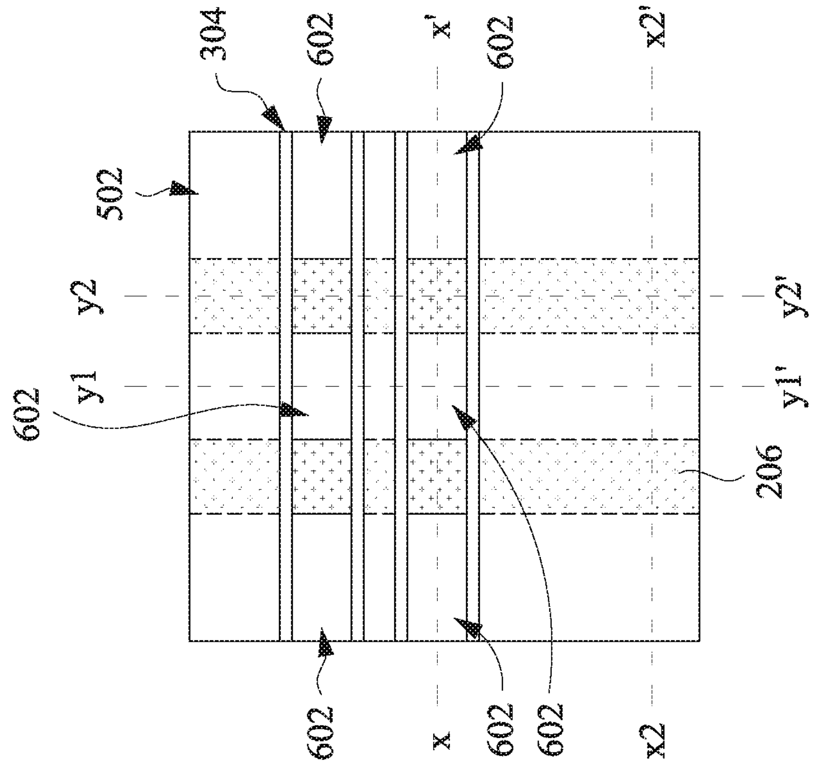
Figure 6B:
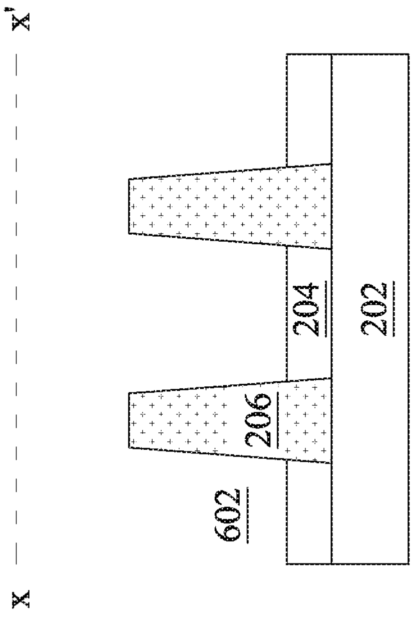
Figure 6C:
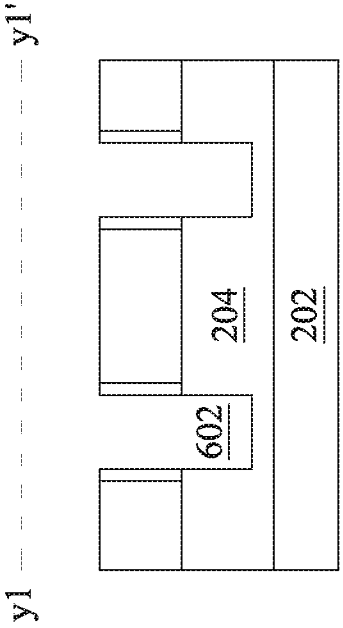
Figure 6D:
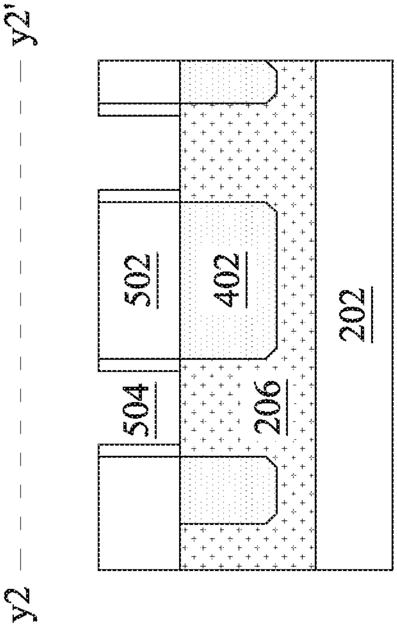
Figure 6E:
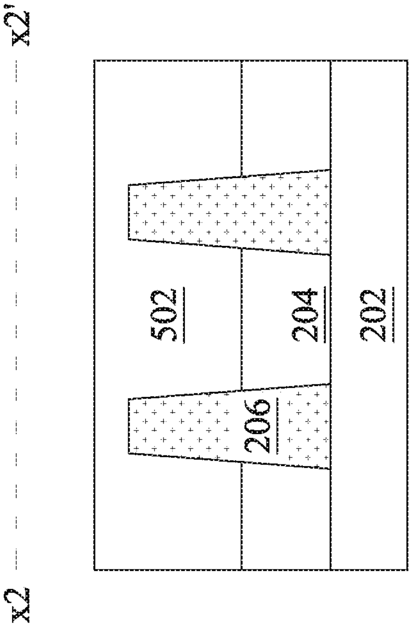
FIGS. 6E, 7E 8E, and 9E are fragmentary cross-sectional views of the FinFET device in an X2-X2' plane cut of the respective top view figure at various fabrication stages, such as those associated with the method of FIG. 1, according to various aspects of the present disclosure.

At block 106 of the method 100, a dummy gate structure or stack is formed over the active regions (e.g., semiconductor structures or fins). Referring to the example of FIGS. 3A, 3B, 3C, and 3D, gate stacks illustrated as gate stack 302 are formed over portions of fins 206 and over isolation feature 204. Gate stacks 302 extend lengthwise in a direction that is different than (e.g., orthogonal to) the lengthwise direction of fins 206. For example, gate stacks 302 extend substantially parallel to one another along the x-direction, having a length defined in the x-direction, a width defined in the y-direction, and a height defined in the z-direction. Gate stacks 302 are disposed between S/D regions of fins 206, where channel regions of fins 206 underlie gate stacks 302. In the X-Z plane, gate stacks 302 wrap top surfaces and sidewall surfaces of fins 206 as shown in FIG. 3B. In the Y-Z plane, gate stacks 302 are disposed over top surfaces of respective channel regions of fins 206 as shown in FIG. 3D and top surfaces of the isolation feature 204 as shown in FIG. 3C. In the depicted embodiment, gate stacks 302 are dummy gate stacks that include a dummy gate electrode. A dummy gate electrode includes a suitable dummy gate material, such as a polysilicon layer. Gate stacks 302 can thus be referred to as poly (PO) gate stacks, in some embodiments. In some implementations, a hard mask layer is formed over the polysilicon layer. A hard mask layer incudes silicon oxide, silicon carbide, silicon nitride, other suitable hard mask material, or combinations thereof. In some embodiments, gate stacks 302 further includes a gate dielectric disposed between dummy gate electrode and fins 206, where the gate dielectric includes a dielectric material, such as silicon oxide, a high-k dielectric material, other suitable dielectric material, or combinations thereof. In some embodiments, the gate dielectric includes an interfacial layer (for example, a silicon oxide layer) disposed over fins 206 and a dielectric layer disposed over the interfacial layer. The gate dielectric layer may be sacrificial or used in forming the gate structure of the device 200. Gate stacks 302 can include numerous other layers, for example, capping layers, interface layers, diffusion layers, barrier layers, or combinations thereof. Gate stacks 302 are formed by deposition processes, lithography processes, etching processes, other suitable processes, or combinations thereof. For example, a deposition process is performed to form a dummy gate electrode layer over fins 206 and isolation feature 204 and a hard mask layer over the dummy gate electrode layer. In some embodiments, before forming the dummy gate electrode layer, a deposition process is performed to form a gate dielectric layer over fins 206 and/or isolation feature 204. In such embodiments, the dummy gate electrode layer is deposited over the gate dielectric layer. The deposition process includes CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), plasma enhanced ALD (PEALD), low-pressure CVD (LPCVD), atomic layer CVD (ALCVD), atmospheric pressure CVD (APCVD), other suitable methods, or combinations thereof. A gate patterning process (including, for example, various lithography processes, etching processes, and/or cleaning processes) are then performed to pattern the dummy gate electrode layer and the hard mask layer (and, in some embodiments, the gate dielectric layer) to form gate structures 302 as depicted in FIGS. 3A, 3B, 3C, and 3D.

After forming a dummy gate structure, gate spacers are formed along sidewalls of the gate stack. Referring to the example of FIGS. 3A, 3B, 3C, and 3D, gate spacers 304 are formed on sidewalls of the dummy gate structure 302. Forming gate spacers can include forming a spacer material dielectric layer over the gate stack 302 and the fin 206, and performing one or more spacer etch processes. The deposition process may be CVD, PECVD, ALD, PEALD, PVD, other suitable deposition process, or combinations thereof. The dielectric material can include silicon, oxygen, carbon, nitrogen, other suitable spacer constituent, or combinations thereof (for example, silicon oxide, silicon nitride, silicon oxynitride (SiON), silicon carbide, silicon carbon nitride (SiCN), silicon oxycarbide (SiOC), silicon oxycarbon nitride (SiOCN), silicon boron carbon nitride (SiBCN), etc.). In an embodiment, spacer layer 240 includes silicon and nitrogen (and thus may be referred to as a silicon nitride spacer). In some embodiments, spacer layer 240 is a single layer, such as one silicon nitride layer. In some embodiments, spacer layer 240 includes multiple layers, such as a first dielectric layer disposed over a second dielectric layer. For example, the first dielectric layer can include silicon carbon nitride and the second dielectric layer can include silicon nitride.

At block 108 of the method 100, source/drain features may be formed. For example, forming the source/drain features may include forming recesses in the source/drain regions of the fin 206, and epitaxially growing source/drain material in the recesses to fill the recesses, thereby forming semiconductor source/drain features. In some embodiments, a depth of source/drain recesses is greater than about 20% of fin height FH1. In some embodiments, a depth of source/drain recesses is between about 20% and 90% of fin height FH1. In an embodiment, a width of the fin (e.g., critical dimension (CD)) is approximately x nm, the fin height FH1 is approximately 6*x–10*x nm and the recess depth is approximately 5*x–8*x nm.

In the example of FIGS. 4A, 4B, 4C, and 4D, epitaxial source/drain features 402 are formed in source/drain recesses formed in the fin 206. A first gate structure 302 interposes respective epitaxial source/drain features 402, such that a channel region is defined between the respective epitaxial source/drain features 402. In some embodiments, a first gate structure 302 and its respective epitaxial source/drain features 402 form a portion of a first FinFET, and a second gate structure and its respective epitaxial source/drain features 402 form a portion of a second FinFET. In some implementations, a source/drain feature 402 may be shared by adjacent gate structures 302.

In some embodiments, a deposition process is performed to fill source/drain recesses with epitaxial semiconductor material, thereby forming epitaxial source/drain features 402. For example, a semiconductor material is epitaxially grown using portions of fins 206 as a seed area. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous (for example, Si-containing gases, such as $SiH_4$, and/or Ge-containing gases, such as $GeH_4$) and/or liquid precursors, which interact with the composition of fins 206 and/or substrate 202. Epitaxial source/drain features 402 are doped with n-type dopants and/or p-type dopants. In some embodiments, epitaxial source/drain features 402 are epitaxial layers including silicon and/or carbon, where the silicon-comprising epitaxial layers or the silicon-carbon-comprising epitaxial layers are doped with phosphorous, other n-type dopant, or combinations thereof. In some embodiments, epitaxial source/drain features 402 are epitaxial layers including silicon and germanium, where the silicon-and-germanium-compromising epitaxial layers are doped with boron, other p-type dopant, or combinations thereof. In some embodiments, epitaxial source/drain features 402 include materials and/or dopants that achieve desired tensile stress and/or compressive stress in the channel regions. In some embodiments, epitaxial source/drain features 402 are doped during deposition by adding impurities to a source material of the epitaxy process. In some embodiments, epitaxial source/drain features 402 are doped by an ion implantation process subsequent to a deposition process. In some embodiments, annealing processes are performed to activate dopants in epitaxial source/drain features 402 and/or other source/drain regions of FinFET device 200 (for example, HDD regions and/or LDD regions).

Turning to FIGS. 5A, 5B, 5C, and 5D, FinFET device 200 can undergo additional processing. For example, a dielectric layer 502 is formed over fins 206, gate stacks 302, gate spacers 304, and epitaxial source/drain features 402. Dielectric layer 502 can include an interlayer dielectric (ILD) layer and a contact etch stop layer (CESL). ILD layer includes a dielectric material including, for example, silicon oxide, carbon doped silicon oxide, silicon nitride, silicon oxynitride, tetraethyl orthosilicate (TEOS), PSG, BSG, boron-doped phosphosilicate glass (BPSG), fluorine-doped silicate glass (FSG), Black Diamond® (Applied Materials of Santa Clara, California), xerogel, aerogel, amorphous fluorinated carbon, parylene, benzocyclobutene (BCB)-based dielectric material, SiLK (Dow Chemical, Midland, Michigan), polyimide, other suitable dielectric material, or combinations thereof. In some embodiments, the dielectric layer 502 includes a low-k dielectric material, which generally refers to a dielectric material having a low dielectric constant relative to the dielectric constant of silicon dioxide ($k \approx 3.9$). For example, low-k dielectric material has a dielectric constant less than about 3.9. In some embodiments, the low-k dielectric material has a dielectric constant less than about 2.5, which can be referred to as an extreme low-k (ELK) dielectric material. CESL may be a portion of the dielectric layer 502 and include a dielectric material that is different than the dielectric material of ILD layer. ILD layer and/or CESL can include a multilayer structure having multiple dielectric materials. In the depicted embodiment, where ILD layer includes silicon and oxygen (for example, SiCOH, $SiO_x$, or other silicon-and-oxygen comprising material), CESL includes nitrogen and/or carbon (for example, SiN, SiCN, SiCON, SiON, SiC, SiCO, metal nitride, and/or metal carbonitride). ILD layer and/or CESL are formed by a deposition process, such as CVD, PVD, ALD, HDPCVD, MOCVD, RPCVD, PECVD, LPCVD, ALCVD, APCVD, PEALD, other suitable methods, or combinations thereof. In some embodiments, dielectric layer 502 is formed by a flowable CVD (FCVD) process that includes, for example, depositing a flowable material (such as a liquid compound) over substrate 202 and converting the flowable material to a solid material by a suitable technique, such as thermal annealing and/or treating the flowable material with ultraviolet radiation. Subsequent to the deposition of ILD layer and/or CESL, a chemical mechanical polish (CMP) process and/or other planarization process is performed, such that the dielectric layer 502 has a substantially planar surfaces and a top surface of the gate structure 302 is exposed.

After forming dielectric layer 502, gate stacks 302 are removed through suitable etching processes. In an embodiment, a dummy gate dielectric and/or dummy gate electrode are removed to form gate trenches (or openings) 504 as illustrated in FIGS. 5A, 5B, 5C, and 5D. The gate trenches 504 expose the fin 206. The gate trenches 504 also expose the isolation feature 204. The gate trenches 504 may be defined by the spacers 304.

Block 112 of the method 100 of FIG. 1 includes recessing the isolation feature extending between active regions. The isolation features are recessed by etching within the gate trenches formed by the removal of the dummy gate structure. Referring the example of FIGS. 6A, 6B, 6C, 6D, and 6E, the isolation features 204 are recessed in the gate trench 504 regions to form recesses 602. Recesses 602 extend contiguously from the gate trench 504. In an embodiment, the isolation features 204 are recessed removing approximately 2 to 10 nanometers (nm) of the isolation feature 204. In an embodiment, approximately 5 to 20% of the original thickness of the isolation features 204 are removed. In some implementations, the fin height extending above the isolation feature 204 is modified from fin height FH1 to fin height FH2. FH2 may be between about 5 and 20% greater than FH1. In an embodiment, FH2-FH1 is equal to approximately 4 to 8 nm.

The recessing of the isolation feature may be performed by a selective etching process. Generally, the selective etching process may be selective to the material of the isolation feature 204 and not substantially etching the fin 206 and/or the spacers 304. In an embodiment, the etch is also selective such that the dielectric layer 502 is substantially unetched. In an embodiment, the isolation feature 204 is oxide and is etched selectively with respect to the spacer material 304 (e.g., nitride).

The recessing of the isolation feature may be performed by an anisotropic etch process, which generally refers to an etch process having different etch rates in different directions, such that the etch process removes material in specific directions, such as substantially in one direction. Here, the anisotropic etch process is such that the isolation feature 204 is etched substantially vertically (e.g., has a vertical etch rate that is greater than a horizontal etch rate (in some embodiments, the horizontal etch rate equals zero)). The etch thus removes isolation feature material (dielectric such as oxide) in substantially the vertical direction (here, z-direction) with minimal (to no) material removal in the horizontal direction (here, x-direction and/or y-direction). In some embodiments, the etch is a dry etch process, such as an RIE process performs the selective etch. The etch may remove the material of the isolation feature (e.g., silicon oxide) at a higher rate than the materials of spacers (e.g., nitride such as silicon nitride), and/or fins 206 (e.g., silicon) (i.e., the etchant has a high etch selectivity with respect to oxide).

In an embodiment, an atomic layer etch (ALE) is performed to recess the isolation feature. An ALE provides, in sequence alternating between self-limiting chemical modification steps which affect only the top atomic layers of the target material (e.g., isolation feature), and etching steps which remove only the chemically-modified areas, thereby allowing the removal of individual atomic layers. In an embodiment, an ALE is performed a plurality of times, such as 100-140 cycles. The ALE process may include a carrier gas such as argon. The ALE may also include oxygen-containing etchants such as $O_2$, and fluorine-containing etchants such as $C_4F_6$. In some implementations, a selectivity provided by the ALE process of oxide (e.g., $SiO_2$) to nitride (e.g., SiN) is greater than 10:1. In some implementations, a selectivity provided by the ALE process of oxide (e.g., $SiO_2$) to nitride (e.g., SiN) is approximately 11:1. The ALE provides an etching process of introducing the target material (e.g., the isolation feature 204) and feeding reactants to the target material. In an embodiment, the reactants include $C_4F_6$ and $O_2$. The reactants deposit as radicals. An ion is then introduced for etching, for example, by bombardment. In some implementations the ion is argon. There is a desorption that removes an atomic layer from the target material. This process is completed for as many cycles as required to remove the desired target material thickness. In an embodiment, the process is implemented at between approximately 100 C-160 C. In an embodiment, the pressure of the process is between approximately 10 mTorr and approximately 20 mTorr. In some implementations, the etching may be performed by an etching tool such as dry plasma etching chamber.

In an embodiment, the etching may also or alternatively include etch fluorine-containing etch gas may include fluorine ($F_2$), fluoromethane (e.g., $CH_3F$), difluoromethane (e.g., $CH_2F_2$), trifluoromethane (e.g., $CHF_3$), tetrafluoromethane (e.g., $CF_4$), hexafluoroethane (e.g., $C_2F_6$), sulfur hexafluoride (e.g., $SF_6$), nitrogen trifluoride (e.g., $NF_3$), other fluorine-containing etchant, or combinations thereof; a hydrogen-containing etch gas (for example, $H_2$ and/or $CH_4$), a nitrogen-containing etch gas (for example, $N_2$ and/or $NH_3$); a chlorine-containing etch gas (for example, $Cl_2$, $CHCl_3$, $CCl_4$, and/or $BCl_3$); an oxygen-containing etch gas (for example, $O_2$), a bromine-containing etch gas (for example, HBr and/or $CHBr_3$); an iodine-containing etch gas, other suitable etch gas, or combinations thereof. The etch may be configured to generate a plasma from any of the etch gases disclosed herein, such that the etch uses plasma-excited species for etching in some implementations. In some embodiments, a carrier gas is used to deliver the fluorine-containing etch gas and/or other etch gas. The carrier gas may be an inert gas, such as an argon-containing gas, a helium-containing gas, a xenon-containing gas, other suitable inert gas, or combinations thereof.

Various etch parameters of etch can be tuned to achieve selective and anisotropic etching of isolation feature 204, such as etch gas composition, carrier gas composition, etch gas flow rate, carrier gas flow rate, etch time, etch pressure, etch temperature, source power, RF and/or DC bias voltage, RF and/or DC bias power, cycles (e.g., ALE), other suitable etch parameters, or combinations thereof.

In some implementations, masking elements may be formed over portions of the substrate 202 during the selective etching of the isolation features 204. For example, masking elements may cover the dielectric layer 502.

Figure 7A:
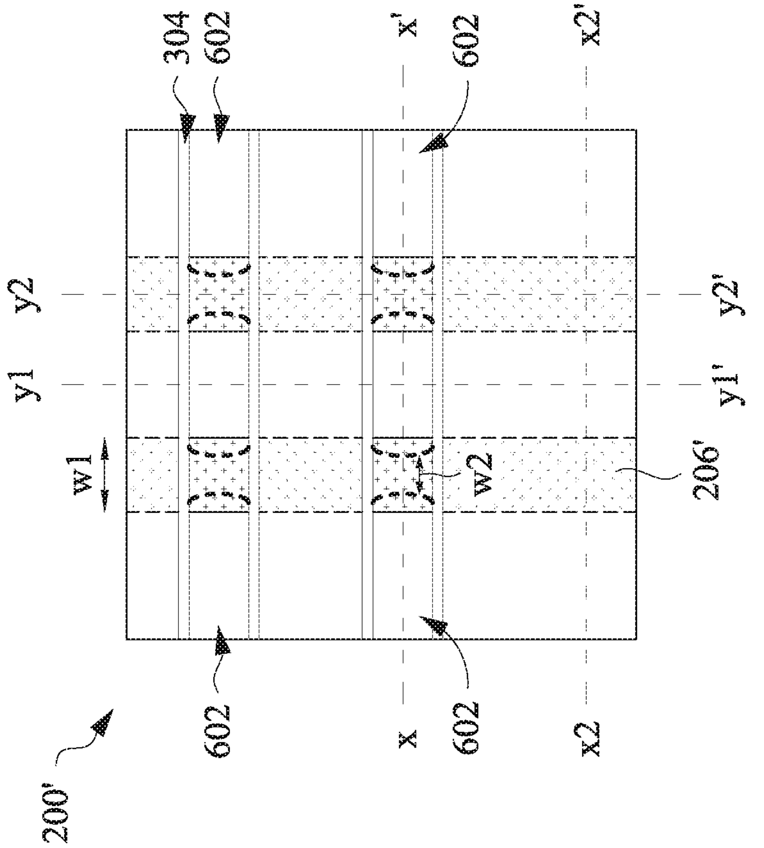
Figure 7B:
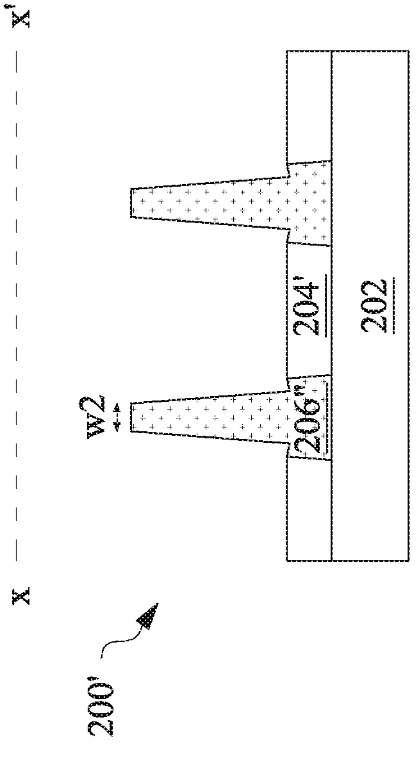
Figure 7C:
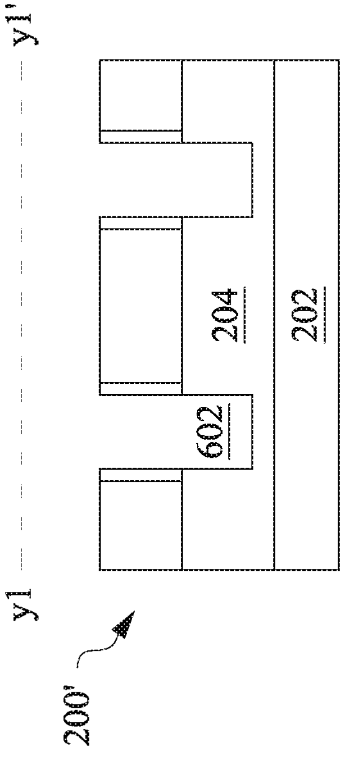
Figure 7D:
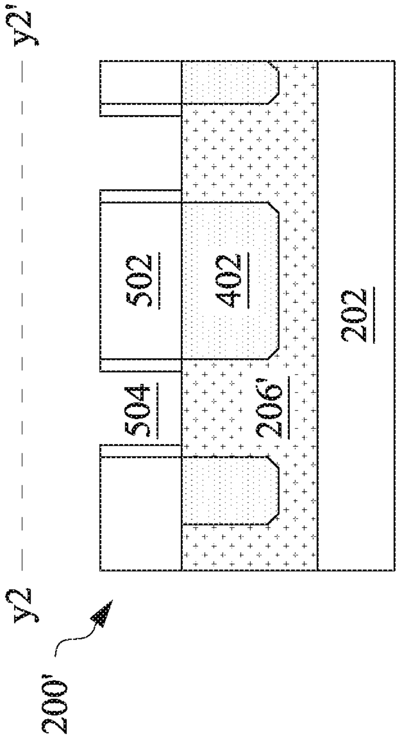
Figure 7E:
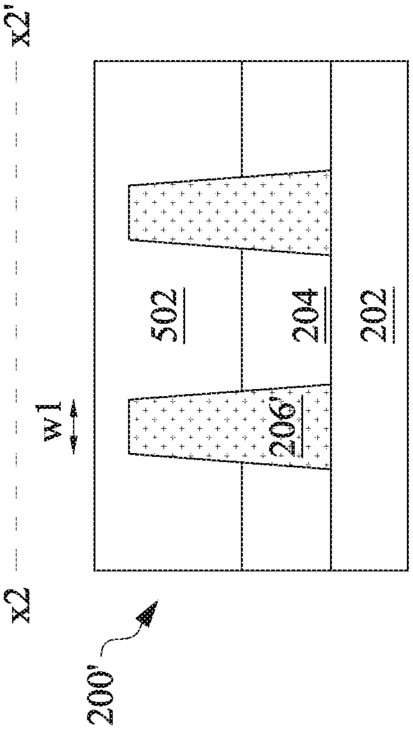
Figure 8A:
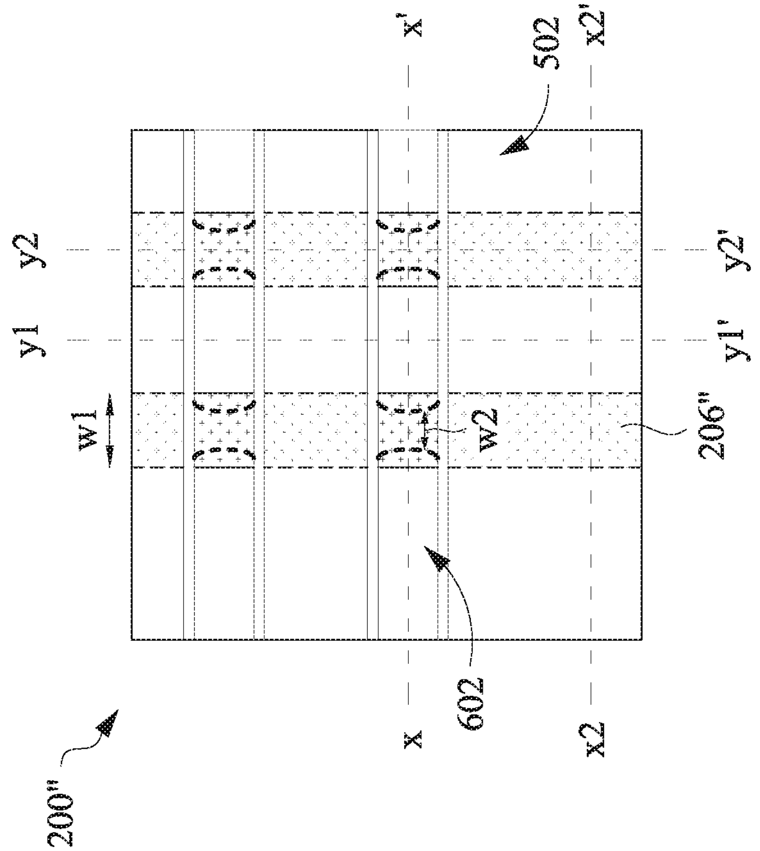
Figure 8B:
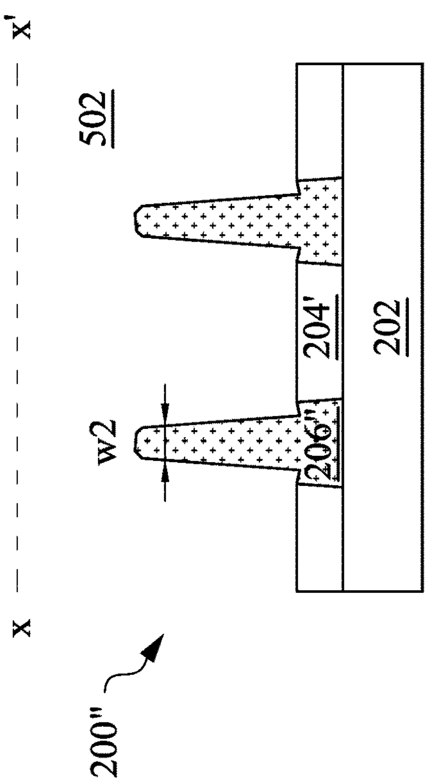
Figure 8C:
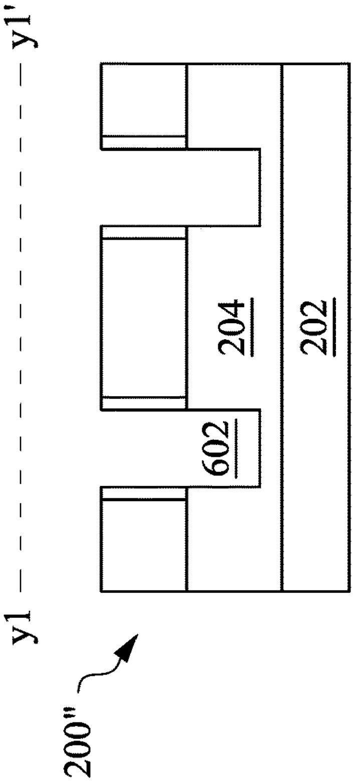
Figure 8D:
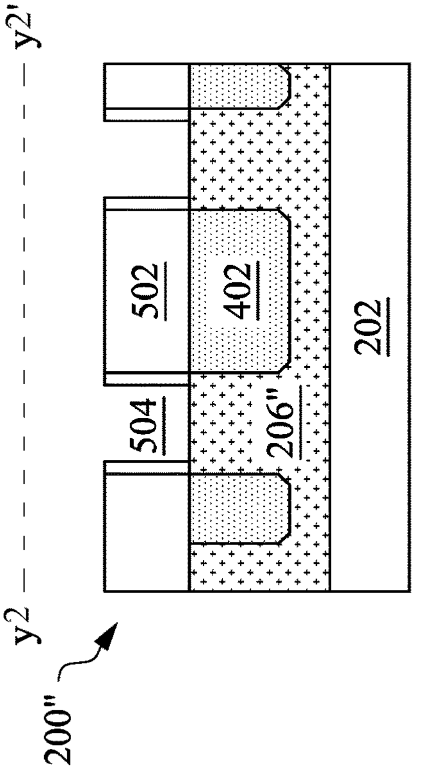
Figure 8E:
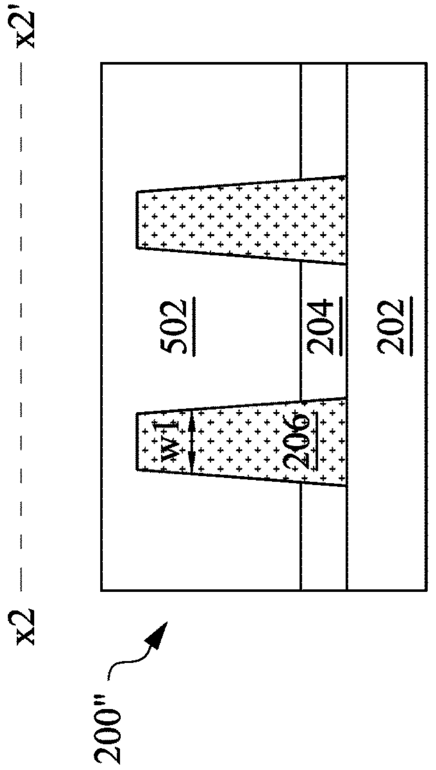
Figure 9A:
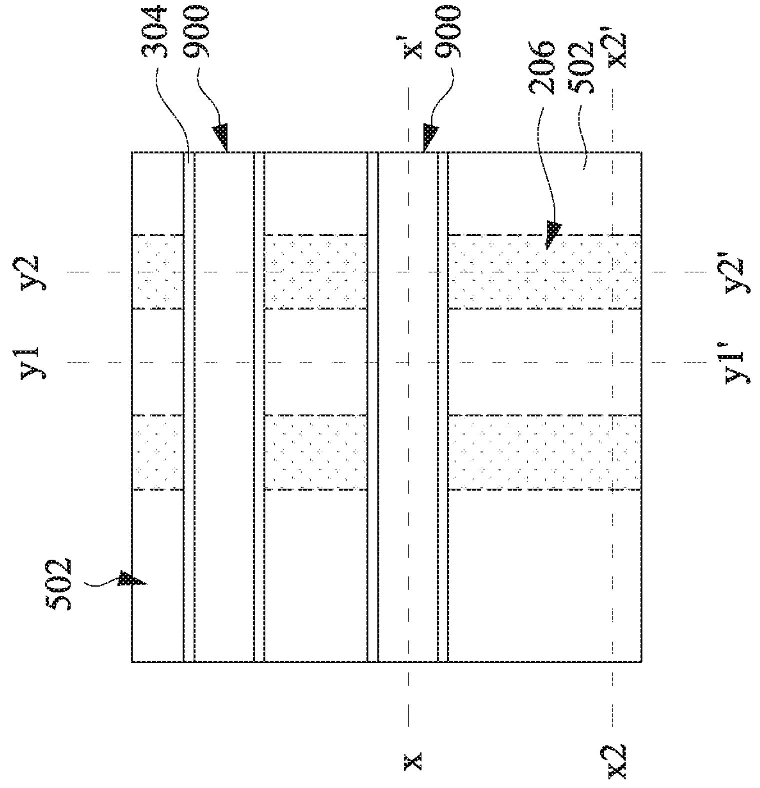
Figure 9B:
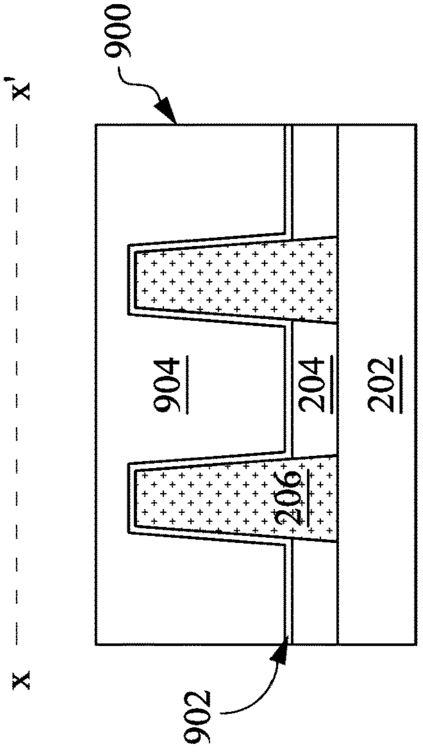
Figure 9C:
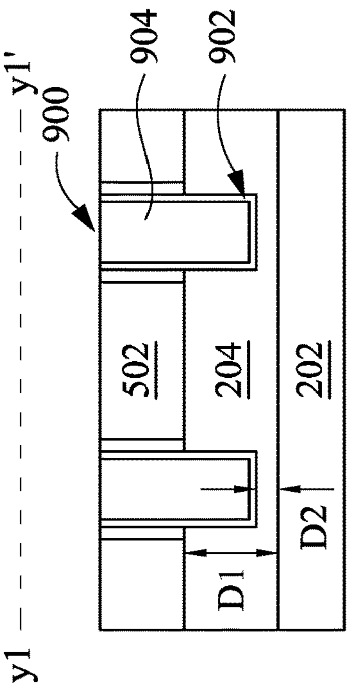
Figure 9D:
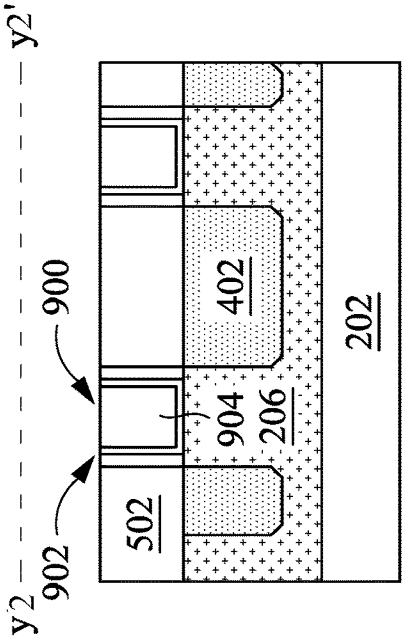
Figure 9E:
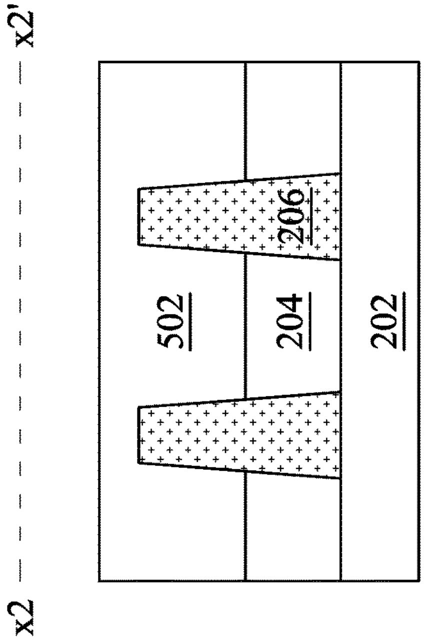

Block 114 of the method 100 of FIG. 1 includes further modifying the channel region of the fin in the gate trench region. In some embodiments, block 114 is omitted. That is, in some embodiments, after increasing a height of the fin 206 by recessing the isolation feature 204, the method 100 proceeds to block 116 without further modification of the channel region. In other embodiments, block 114 is performed where the channel of the active region is modified by modifying its width (as illustrated in FIGS. 7A, 7B, 7C. 7D, and 7E) and/or modifying its shape (as illustrated in FIGS. 8A, 8B, 8C, 8D, and 8E).

In some implementations in block 114, a width of the active region, for example a fin, is decreased. Referring to the example of FIGS. 7A, 7B, 7C, 7D, and 7E, an embodiment of a device 200' illustrates a fin 206' having a portion with a width w2, which is decreased from the width w1 (see FIGS. 7A, 7B). In some embodiments, the width of the fin 206' is reduced by an etching process also referred to as a trim process. In an embodiment, width w2 is at least about 10% less than the width w1. In some examples, the second width w2 is within a range of about 0-10 nanometers smaller than the first width w1. For example, the etching process may remove about 0-5 nanometers from each side of the fin 206 to form the fin 206'. In the present example, the etching process does not reduce the width of the fin 206' underneath the gate spacers 304. The etching process also does not reduce the width of the fin 206' under the dielectric layer 502. The process to reduce the width of the fin 206' may be an isotropic etching process such as a wet etching process. The etching may be selective to the silicon material of the fin 206.

In some implementations in block 114 a rounding of the active region, for example fin, is performed. The rounding of the fin may be performed in addition to the decrease in width of the fin discussed above, or independently. Referring to the example of FIGS. 8A, 8B, 8C, and 8D, an embodiment of the device 200" includes a fin 206" has a width w2, which is decreased from width w1 substantially similar to the device 200' discussed above. In some embodiments, the width of the fin is reduced by an etching process also referred to as a trim process as discussed above. The fin 206" has a rounded tip. The tip rounding may be performed by an anneal process. In some implementations, w2 is measured at 10% below an uppermost surface of the rounded fin 206". It is noted that the rounded tip is constrained to the gate trench region.

Block 116 of the method 100 includes forming a metal gate in the gate trench and on the recessed isolation feature. Referring to the example of FIGS. 9A, 9B, 9C, and 9D, the device 200 includes a metal gate structure 900. Metal gate structure 900 are configured to achieve desired functionality according to design requirements of FinFET device 200, such that one metal gate structure 900 may include the same or different layers and/or materials as a second metal gate structure 900. In some embodiments, metal gate structure 900 include a gate dielectric 902 (for example, a gate dielectric layer) and a gate electrode 904 (for example, a work function layer and a bulk conductive layer).

Metal gate structures 900 may include numerous other layers, for example, capping layers, interface layers, diffusion layers, barrier layers, hard mask layers, or combinations thereof. In some embodiments, the gate dielectric layer 902 is disposed over an interfacial layer (including a dielectric material, such as silicon oxide), and the gate electrode is disposed over the gate dielectric layer. The gate dielectric layer 902 includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. High-k dielectric material generally refers to dielectric materials having a high dielectric constant relative to a dielectric constant of silicon dioxide ($k \approx 3.9$). For example, high-k dielectric material has a dielectric constant greater than about 3.9. In some embodiments, the gate dielectric layer is a high-k dielectric layer. The gate electrode 904 includes a conductive material, such as polysilicon, Al, Cu, Ti, Ta, W, Mo, Co, TaN, NiSi, CoSi, TiN, WN, TiAl, TiAlN, TaCN, TaC, TaSiN, other conductive material, or combinations thereof. In some embodiments, the work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, Ag, Mn, Zr, TaAl, TaAlC, TiAlN, TaC, TaCN, TaSiN, other suitable n-type work function materials, or combinations thereof. In some embodiments, the work function layer includes a p-type work function material, such as Ru, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The bulk conductive layer may additionally or collectively include polysilicon, Ti, Ta, metal alloys, other suitable materials, or combinations thereof.

Due to the etching back of the isolation feature 204 in block 112, a thickness of isolation region 204 under the metal gate 900 is less than the thickness of the isolation feature 204 outside of the metal gate 900, for example, under the dielectric layer 502. Referring to the example of FIG. 9C, the isolation region 204 has a thickness D2 under the metal gate 900 and a thickness D1 outside of under the metal gate 900. The thickness D1 is greater than the thickness D2. In an embodiment, a thickness difference (i.e., D1−D2) between the thickness D1 and the thickness D2 is between approximately 3 nanometers and 10 nanometers. In an embodiment, the thickness difference (i.e., D1−D2) is at least 3 nanometers.

It is noted that the device 200 as illustrated in FIGS. 9A, 9B, 9C, 9D, and 9E is illustrated having the recessing of block 112 to provide a modified height of the fin structure, but do not include the block 114 reduction of the width or the rounding of the fin structures. In other embodiments, the metal gate structures are formed over the fin 206' and/or fin 206" in substantially the same manner.

Figure 10:
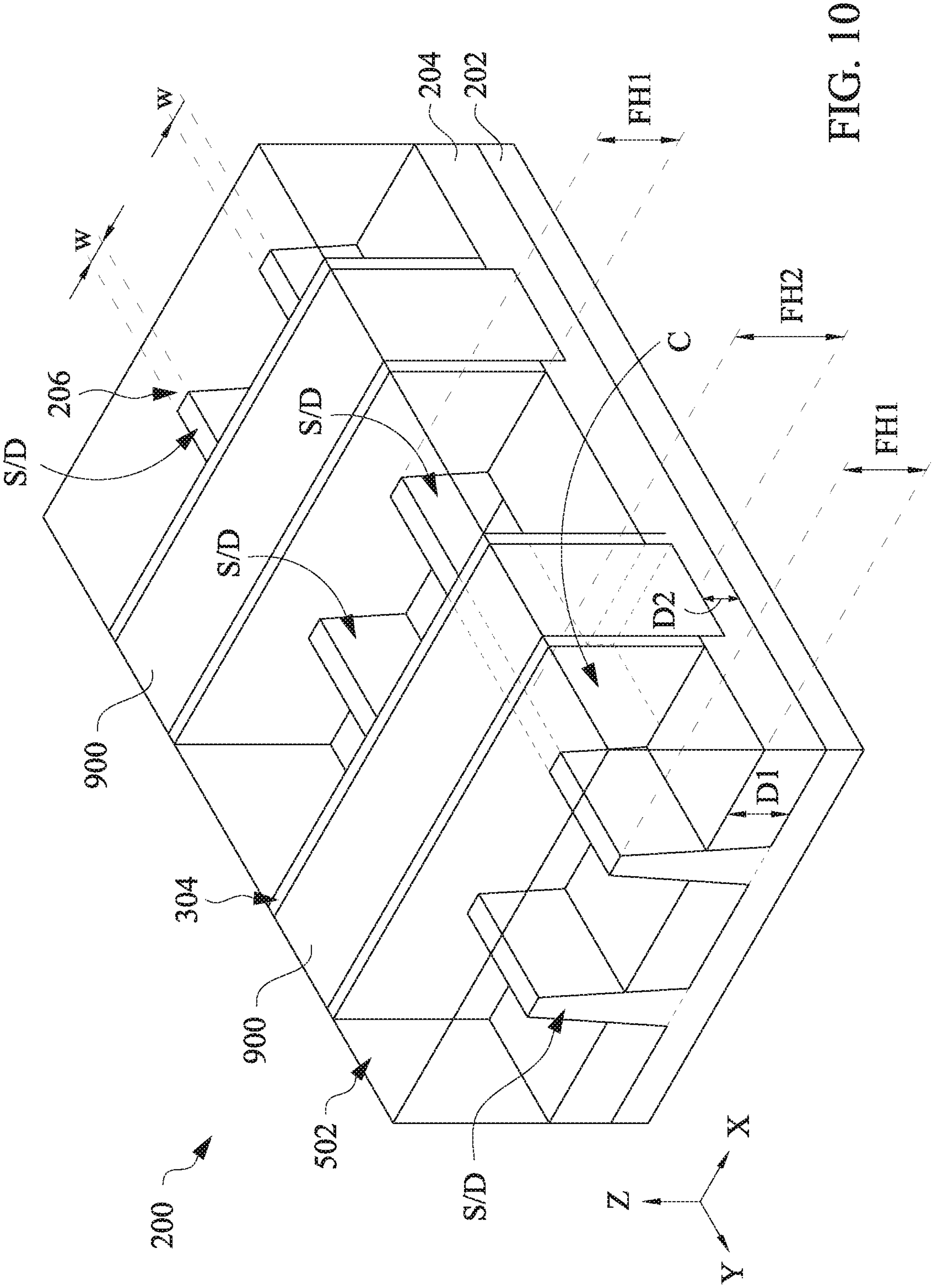
FIG. 10 is a perspective view of an embodiment of FinFET device according to various aspects of the present disclosure.

FIG. 10 illustrates an embodiment of the FinFET device 200 illustrated in perspective view. Similar numbers refer to similar elements. As illustrated, the fin 206 includes a FH1 above the isolation feature 204 in the S/D region and a FH2 height above the isolation feature 204 in the channel region (C). The isolation feature 204 includes a sidewall extending in the z-direction with a length FH2−FH1. The sidewall interfaces the gate structure 900.

Block 118 of the method 100 includes continued processing of the device. In some embodiments, various interconnects of multi-layer interconnect (MLI) features are formed to facilitate operation of FinFET device 200. MLI feature electrically couples various devices (for example, transistors, resistors, capacitors, and/or inductors) and/or components (for example, gate structures and/or source/drain features) of FinFET device 200, such that the various devices and/or components can operate as specified by design requirements of FinFET device. MLI feature includes a combination of dielectric layers, such as dielectric layer 502, and conductive layers configured to form various interconnects. During operation of FinFET device 200, the interconnects are configured to route signals between the devices and/or the components of FinFET device 200 and/or distribute signals (for example, clock signals, voltage signals, and/or ground signals) to the devices and/or the components of FinFET device 200. The conductive layers are configured to form vertical interconnects, such as device-level contacts and/or vias, and/or horizontal interconnects, such as conductive lines. Vertical interconnects typically connect horizontal interconnects in different layers (or different planes) of MLI feature. Device-level contacts (also referred to as local interconnects or local contacts) electrically couple and/or physically couple IC device features such as the source/drain features 402 and the metal gate structure 900 to other conductive features of the MLI feature, such as vias. Device-level contacts include metal-to-poly (MP) contacts, which generally refer to contacts to a gate structure, such as a poly gate structure or a metal gate structure, and metal-to-device (MD) contacts, which generally refer to contacts to a conductive region of FinFET device 200, such as epitaxial source/drain features 402.

Source/drain or gate contacts includes a conductive material, such as metal. Metals include aluminum, aluminum alloy (such as aluminum/silicon/copper alloy), copper, copper alloy, titanium, titanium nitride, tantalum, tantalum alloy, tantalum nitride, tungsten, tungsten alloy, cobalt, cobalt alloy, ruthenium, ruthenium alloy, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, a damascene process and/or dual damascene process is used to form a copper-based MLI feature.

Thus, provided are devices and methods that allow for increasing a channel region height (e.g., in a z-direction) in a multi-gate device. The methods and devices allow for a relatively decreased height (e.g., in the z-direction) of the active region (e.g., fin) outside of the channel region. The height, width, and channel length are the geometric dimensions that characterize a FinFET's behavior. The devices and methods of the present disclosure allow for tuning the fin dimensions in the channel region differently from those in other regions, where other performance characteristics (e.g., stability) may be important. Increasing the fin height in the channel region may provide for a higher relative drive current at the same footprint for the device. The drain current may also be improved by the increase fin height. The thickness of a fin influences the short-channel behavior; it has control over the subthreshold swing, and hence on the efficiency of the FinFET.

In an embodiment, the present disclosure provides a method including forming a first semiconductor structure extending from a substrate in a first direction. The first semiconductor structure has a height along the first direction and the first semiconductor structure extends lengthwise along a second direction that is different than the first direction. The method also includes forming a second semiconductor structure that extends from the substrate in the first direction. And the second semiconductor structure extends lengthwise along the second direction. An isolation structure is formed over the substrate and extends between the first semiconductor structure and the second semiconductor structure in a third direction that is different than the second direction. A dummy gate structure is formed on the substrate over the first semiconductor structure and the isolation structure. The dummy gate structure extends lengthwise along the third direction. The dummy gate structure to form a trench exposing an upper surface of the isolation structure. And the isolation structure is etched exposed in the trench to recess the isolation structure. After etching the isolation structure, a metal gate structure is formed in the trench and on the recessed isolation structure.

In a further embodiment of a method, after forming the dummy gate stack, the first semiconductor structure is recessed and a source/drain is epitaxially grown in the recessed first semiconductor structure. In an embodiment, the gate spacers on the dummy gate stack. And the forming the trench can form the trench defined between the gate spacers. In a further embodiment, etching the isolation structure is a selective etch that leaves the gate spacers substantially unetched. For example, the elective etch includes an etch selectivity between a material of the gate spacers and a material of the isolation structure is about 1:10. In an embodiment, the etching the isolation structure is an anisotropic etch. In an example, the anisotropic etch is performed by an atomic layer etch.

In a further embodiment, the method includes, after etching the isolation structure and prior to forming the metal gate structure, etching the first semiconductor structure to decrease a dimension in the third direction. In an embodiment, the height of the first semiconductor structure in the first direction is measured from a top surface of the isolation structure and after the etching the isolation structure, the first semiconductor structure has an increased height in the first direction measured from the top surface of the isolation structure.

In another of the broader embodiments, a method is provided that includes forming a first fin and a second fin that extend above a substrate and forming an isolation region between the first fin and the second fin. The first fin and second fin have a first fin height above the isolation region. A gate stack is formed over the first fin, the second fin, and the isolation region. An epitaxial source/drain feature is grown in a source/drain region of the first fin. After the growing, the gate stack is removed to form a trench. The method continues including selectively etching the isolation region within the trench between the first fin and the second fin. After the selectively etching the first fin has a second fin height above the isolation region within the trench, the second fin height greater than the first fin height.

In an embodiment, gate spacers are formed on the gate stack and selectively etching includes an etch selectivity of the isolation region to the gate spacers of at least above 10:1. In an embodiment, an interlayer dielectric material (ILD) is deposited after growing the epitaxial source/drain feature. And in an embodiment, after selectively etching the isolation region within the trench, a portion of the first fin under the ILD maintains the first fin height. In some implementations, after the selectively etching, a width of the first fin is trimmed (e.g., decreased) within the trench. In some implementations, the trimmed fin is annealed to round a top surface of the first fin. In an embodiment, the method continues to include forming a metal gate structure on the first fin and the second fin.

In another of the broader embodiments, a semiconductor device is provided that includes a first semiconductor structure and a second semiconductor structure each extending above a substrate in a first direction and having a length extending in a second direction. An isolation structure extends between a bottom portion of the first semiconductor structure and a bottom portion of the second semiconductor structure. And a first metal gate structure is disposed over a channel region of an upper portion of the first semiconductor structure and a channel region of an upper portion of the second semiconductor structure. The first metal gate structure extends lengthwise along a third direction. An interlayer dielectric layer is disposed over the isolation structure and adjacent the first metal gate structure. The isolation structure has a first thickness under the first metal gate structure and a second thickness under the interlayer dielectric layer, wherein the first thickness is less than the second thickness.

In an embodiment, the first semiconductor structure has a first height measured in the first direction in the channel region of the upper portion of the first semiconductor structure and a second height measured in the first direction outside of the channel region of the upper portion of the first semiconductor structure. The second height less than the first height. And the first height and the second height are measured from a top surface of the isolation structure.

In an embodiment, the semiconductor device includes gate spacers on sidewalls of the first metal gate structure, wherein the first semiconductor structure has the second height under the gate spacers. In an embodiment, the first semiconductor structure has a first width in the channel region of the upper portion of the first semiconductor structure and a second width outside of the channel region of the upper portion of the first semiconductor structure, the first width less than the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first semiconductor structure extending from a substrate in a first direction, wherein the first semiconductor structure has a height along the first direction and the first semiconductor structure extends lengthwise along a second direction that is different than the first direction;

forming a second semiconductor structure that extends from the substrate in the first direction, wherein the second semiconductor structure extends lengthwise along the second direction;

forming an isolation structure over the substrate and extending between the first semiconductor structure and the second semiconductor structure in a third direction that is different than the second direction;

forming a dummy gate structure on the substrate over the first semiconductor structure and the isolation structure, wherein the dummy gate structure extends lengthwise along the third direction;

removing the dummy gate structure to form a trench exposing an upper surface of the isolation structure;

etching the isolation structure exposed in the trench to recess the isolation structure, wherein the etching the isolation structure is performed by an atomic layer etch; and after etching the isolation structure, forming a gate structure in the trench and on the recessed isolation structure.

2. The method of claim 1, further comprising:

after forming the dummy gate structure, recessing the first semiconductor structure and epitaxially growing a source/drain in the recessed first semiconductor structure.

3. The method of claim 1, further comprising:

forming gate spacers on the dummy gate structure; and wherein the forming the trench forms the trench defined between the gate spacers.

4. The method of claim 3, wherein the etching the isolation structure is a selective etch that leaves the gate spacers substantially unetched.

5. The method of claim 4, wherein the selective etch includes an etch selectivity between a material of the gate spacers and a material of the isolation structure is about 1:10.

6. The method of claim 1, wherein the etching the isolation structure is an anisotropic etch.

7. The method of claim 1, wherein the atomic layer etch is performed for about 100-140 cycles.

8. The method of claim 1, further comprising: after etching the isolation structure and prior to forming the metal gate structure, etching the first semiconductor structure to decrease a dimension in the third direction.

9. The method of claim 1, wherein the height of the first semiconductor structure in the first direction is measured from a top surface of the isolation structure and wherein after the etching the isolation structure, the first semiconductor structure has an increased height in the first direction measured from the top surface of the isolation structure.

10. A method, comprising:

forming a first fin and a second fin that extend above a substrate;

forming an isolation region between the first fin and the second fin, wherein the first fin and second fin have a first fin height above the isolation region;

forming a gate stack over the first fin, the second fin, and the isolation region;

growing an epitaxial source/drain feature in a source/drain region of the first fin;

after the growing, removing the gate stack to form a trench; and selectively etching the isolation region within the trench between the first fin and the second fin, wherein after the selectively etching the first fin has a second fin height above the isolation region within the trench, the second fin height greater than the first fin height;

after selectively etching the isolation region, trimming the first fin within the trench; and rounding a top surface of the trimmed first fin.

11. The method of claim 10, further comprising:

forming gate spacers on the gate stack; and wherein the selectively etching includes an etch selectivity of the isolation region to the gate spacers of at least above 10:1.

12. The method of claim 10, further comprising:

depositing an interlayer dielectric material (ILD) after growing the epitaxial source/drain feature.

13. The method of claim 12, wherein after the selectively etching the isolation region within the trench, a portion of the first fin under the ILD maintains the first fin height.

14. The method of claim 10, further comprising:

after the selectively etching, trimming a width of the second fin within the trench.

15. The method of claim 10, further comprising: wherein annealing the trimmed first fin rounds the top surface of the trimmed first fin.

16. The method of claim 10, further comprising:

forming a metal gate structure on the first fin and the second fin.

17. A method, comprising:

forming a first active region and a second active region having an isolation region disposed between the first active region and the second active region;

forming a dummy gate stack over the first active region, the second active region, and the isolation region;

providing spacer elements along the dummy gate stack;

removing the dummy gate stack to form a trench; and recessing the isolation region between the first active region and the second active region within the trench by an atomic layer etching process selective to isolation region without substantial etching of the spacer elements.

18. The method of claim 17, wherein the recessing the isolation region is an anisotropic etching having a substantially vertical direction.

19. The method of claim 17, wherein after the atomic layer etching, at least one of a width or a shape of the first active region is modified.

20. The method of claim 17, wherein the ALE includes at least one of oxygen or fluorine etchants.

* * * * *